United States Patent [19]

Logan

[11] Patent Number: 4,731,577
[45] Date of Patent: Mar. 15, 1988

[54] COAXIAL PROBE CARD

[76] Inventor: John K. Logan, 26527 Silver Spur Rd., Rancho Palos Verdes, Calif. 90274

[21] Appl. No.: 22,056

[22] Filed: Mar. 5, 1987

[51] Int. Cl.⁴ ............................ G01R 1/04; H01P 5/22
[52] U.S. Cl. ............................ 324/158 F; 324/158 P; 324/73 PC; 333/246
[58] Field of Search ........... 324/158 P, 158 F, 73 PC, 324/72.5; 333/12, 246, 247

[56] References Cited

U.S. PATENT DOCUMENTS

| | | | |
|---|---|---|---|
| 3,560,907 | 2/1971 | Heller | 439/862 X |
| 3,869,698 | 2/1975 | Beltz | 382/53 |
| 3,906,363 | 9/1975 | Fowler | 324/158 P X |
| 4,045,737 | 8/1977 | Coberly | 324/158 P X |
| 4,061,969 | 12/1977 | Dean | 324/73 PC X |
| 4,063,172 | 12/1977 | Faure et al. | 324/158 P X |
| 4,065,717 | 12/1977 | Katter et al. | 324/158 P X |
| 4,633,203 | 12/1986 | Nowak | 333/246 X |
| 4,672,312 | 6/1987 | Takamine et al. | 324/158 F X |

FOREIGN PATENT DOCUMENTS 1521614 8/1978 United Kingdom .

Primary Examiner—Reinhard J. Eisenzopf
Assistant Examiner—Vinh P. Nguyen
Attorney, Agent, or Firm—Gordon K. Anderson

[57] ABSTRACT

A multipoint microwave coaxial probe card which has a printed circuit (20) with an edge connector (24) and a mounting ring (30) attached to the surface. A series of ceramic stripline needle assemblies (38) are bonded to the board around a hole (22) in the center of the board for compliance with the pads on the component under test. Microwave connectors (34) are mounted into the ring with coaxial cable (42) electrically connecting to the needle assemblies. A portion of the needle assemblies are joined to the edge connector by insulated wires (44) allowing both high and low frequency signals to be utilized simultaneously. A shield in the form of a flat plate (48), with a cover (54), enclose the ring and provide RFI and EMI shielding. The coaxial probe card fulfills the need to provide shielded dual frequency testing of microwave semi-conductor wafers heretofore unavailable.

9 Claims, 9 Drawing Figures

COAXIAL PROBE CARD

TECHNICAL FIELD

This invention relates to electrical measurement for testing using voltage probes with a panel circuit arrangement having electrical connectors in general, and more particularly to microelectronic circuit board or chip node inspection point continuity testing probe cards.

BACKGROUND ART

Structures for probing small pads in close proximity have been known and are in common use, however, due to inherent problems of maintaining conformance and limiting the background noise and cost constraints, prior art has not, as yet, filled the need for combination high and low frequency shielded probe cards in the still advancing technology of microelectronic circuits.

A search of the prior art did not disclose any patents that read directly on the claims of the instant invention, however, the following U.S. patents were considered related:

| Patent No. | Inventor | Issue Date |
| --- | --- | --- |
| 4,065,717 | Katter et al | Dec. 27, 1977 |
| 4,063,172 | Faure et al | Dec. 13, 1977 |
| 4,061,969 | Dean | Dec. 6, 1977 |
| 4,045,737 | Coberly | Aug. 30, 1977 |
| 3,906,363 | Fowler | Sep. 16, 1975 |
| 3,869,698 | Beltz | Feb. 18, 1975 |
| 3,560,907 | Heller | Feb. 2, 1971 |

Katter et al teaches a plurality of leads on a backing plate that is transparent and resilient. The ends of the leads are provided with raised portions which establish the probes, preferably formed by conventional thin film or plating techniques. A vacuum is pulled on the chip under test firmly securing it in place while pressure is applied above the resilient backing plate causing deformation to occur, moving the probes into contact with the workpiece.

Faure et al apply a group of probes for multiple site chip clusters with a plurality of cams cooperating with followers to independently locate each cluster or groups of probes so as to compensate for accumulated tolerance or shrinkage in long substrates. Clusters of probes are moved with a single adjustment laterally, as a group, with the probes taking advantage of the collapsing column or buckling beam configuration for compliance.

Dean employs a series of pins embedded into a sealed flexible membrane with wires attached to the pins passing through an airtight seal. A vacuum is pulled within a chamber formed by the membrane causing the pins to obtain conformance with the workpiece under this negative pneumatic pressure. Dean also takes advantage of the previously described spring loaded probes in another embodiment.

Coberly discloses a plastic substrate provided with a groove in which an electrically conductive contact or probe is positioned within a key portion. The probe contains a pair of cantilevers which bias against the edge of the substrate providing a planarity stop serving as vertical alignment. The bias produced by the cantilevers is overcome and a flat raises upwardly from the edge of the substrate as the point touches the chip. The electrical conductive flowpath is continued from the probe via a wire lead to a binding post and, hence, to collateral test apparatus.

Fowler teaches a wire positioned between two plates with one end restrained and the other slideably engaged. The moveable end projects through the plate and contacts the element under test. The wire or needle deforms within its elastic limits, as a collapsing column when pressed onto the node points of the workpiece. The expense of drilling two corresponding plates is high and the needles have a tendency to run into each other when depressed, limiting the reliability of thrs art.

Beltz et al discloses a plurality of leads simultaneously bent into a truncated shape. The probe fingers are an extension of the lead, as above, but are formed at the same time with a conventional die set after the leads are secured in a plastic material. The fingers or probe tips are separated by severing with a sharp instrument. Further, the leads may be lapped to impart to them the desired degree of flatness and smoothness, as to not damage the semiconductor beam leads on which they rest during probing.

While the prior art addresses the problem of compliance and provides an electrical flowpath for frequencies up to 1.0 megahertz using conventional wires and conductive structure, it is still lacking in structure that is capable of conveying both low and high frequency signals as separate means to conduct each signal together. Further, no allowance has been given to shield the measuring device from unwanted RFI and EMI simultaneously.

For background purposes and as indicative of the art to which the invention relates, reference may be made to the remaining cited patents.

DISCLOSURE OF THE INVENTION

The usual procedure in semiconductor wafer manufacture includes the probing of patterns on the wafer to test the internal circuitry. Fixed point probe cards are normally used for probing of wafers up to one megahertz. However, at higher frequencies commercial probe cards have excessive cross-talk and radiation due to the long unshielded leads. Some unpatented prior art uses microwave connectors and probes attached to a microstrip on a sapphire probe card for high frequency probing with spring loaded interface between the connector and the stripline. Others use a coplanar wave guide on a tapered substrate embracing a connector mounted block with raised tips for compliance.

At frequencies above 500 megahertz the interface connection to the probe card or probe fixture becomes critical. Standing waves or reflections generated by improper connection of the probe could destroy the test signal completely. At these high frequencies subminiature, or microminiature, coaxial connectors must be used to interconnect the probe fixture to coaxial cables that carry the test signals to the test equipment.

Prior art has also utilized a ground plane stripline microstrip and coplanar wave guide structures to conduct signals on probe cards, however, it is necessary that unshielded probe needles project from the card in order to contact the input or output pads of the chips on the wafer. These unshielded probe needles have the electrical properties of inductance. At Frequencies over approximately 500 megahertz, this inductance results in an impedance that becomes so great that it completely blocks the signals from the chip under test. It is, however, necessary that needles of some length project beyond the probe test fixture. This is requisite to provide the operator with visibility of the needle tips in contact with the pads on the chip. Typically, the pads are only 0.002 inches×0.002 inches (0.005×0.005 centimeters) in size or could be up to double that magnitude. The proper alignment of the probe needles on the chip pads is, therefore, essential if valid test results are to be obtained. Further, the projecting needles provide compliance, as there is always some degree of out of plane condition existing between the probe fixture and the wafer under test. Additionally, needles on the probe fixture may not necessarily be coplanar, therefore, in order to avoid abuse by gouging or piercing the device pads, the needles must have some resiliency to prevent this damage. Fixed point probe cards for DC and low frequency semi-conductor wafer probing have been in wide use for over 15 years. Similarly, various devices for measuring high frequency signals have existed for many years. However, it is only very recently, with the advent of Gallium Arsenide as a commercially practical semi-conductor material, that a need has arisen to apply fixed point probe cards to the probing of semiconductor wafers at high frequencies, much above those that there was a need for previously.

With this in mind, a primary object of the invention is to obtain a combination high frequency and low frequency probe card that provides the advantage of using connectors and coaxial cables for the requisite high frequency and the convenience and cost advantage of a conventional edge card connector for low frequency, ground and direct current power supply signals in a completely shielded enclosure with no new expensive and exotic equipment required. The typical prior art semi-conductor device has a plurality of signal output locations and some of these carry high frequency signals, while a majority may carry low frequency or DC signals which do not require unusual fixturing on the probe card. The invention permits the non-critical or low frequency signals to be conducted out of the probe card through low cost insulated solid wires. At the same time, the critical high frequency signals may be conducted out of the card via coaxial cables and high frequency connectors. These low and high frequency output probes may be utilized in any combination that is dictated by the semi-conductor device that is to be probed. This is an advance over other high frequency test fixtures that require a certain pre-layout of the device under test if they are to be accommodated by the probe fixture. A mechanical shield of structural metal completely encloses the device to eliminate radio frequency interference and electromagnetic interference (RFI and EMI) present in the environment. This is particularly important in areas where screen rooms are not available and the wafer under test is ultra sensitive to interference of this type. Many probe stations are normally equipped with receptacles that receive edge card connectors, and coaxial cables are directed independent of the station, making the device extremely adaptable to existing equipment and adding greatly to its flexibility and effectiveness of cost.

An important object of the invention allows the use of commercially available ceramic stripline needle probe assemblies, such as manufactured by Wentworth Laboratories, Inc., under their type number ACS. These needles have the stripline on one side of a ceramic substrate and a ground plane on the other, with the requisite dielectric constant providing the desired 50 ohm impedance. The use of this component also provides a convenient location to mount an optional chip resistor, or chip capacitor, on either the stripline side or interface at the metalized or ground plane side. The 50 ohm resistor ensures a constant 50 ohm environment all the way to the base of the probe needle, or within 0.075"0 (0.019 cm) of the device under test. The chip capacitor provides a low impedance path to ground for spurious signals and oscillations that might otherwise interfere with the test signals.

Inasmuch as needles are an optimum expedient to accomplish this probe procedure, it is an important object of the invention to obtain the shortest probe needles possible. This is accomplished by mounting the needles on the bottom edge of the ceramic stripline substrate. This permits testing at frequencies up to 10 gigahertz before the inductance of the probe needle causes an excessively high impedance to the electronic signals. Compliance is still provided, even with the short probe needles. This allows the bending of the needles to occur to compensate for the difference of out of plane conditions that occur on the pads of the semiconductor device. These pads are very delicate and may be as thin as 500 angstroms and are subject to punch through. The instant invention with these needles overcomes this problem allowing compliance on all the pads without any lasting or detrimental effect.

Still another object of the invention allows easy attachment of the stripline needle to the coaxial cable. The center conductor is soldered directly to the stripline on one side of the substrate and the shield to the ground side with the dielectric insulator terminating in the middle. Not only is this connection simply achieved, but attachment of the needle to the ground plane of the ceramic card is also straightforward and cost effective, as the two ground planes are soldered by conventional means to each other at right angles.

Yet another object of the invention allows the use of commercially available high frequency connectors that are attached to the ceramic stripline needles with conventional coaxial cable. This unique positioning of the connectors next to edges of the substrate drastically reduces standing waves and reflections and permits testing at the required higher frequencies. The preferred embodiment installs the connectors parallel, but offset, to the plane of the substrate, however, in another embodiment the connectors are placed angularly in order to provide a still lower impedance path from the connector to the stripline on the substrate.

A further object of the invention is directed to physical size allowing it to be accommodated in a standard commercial probe fixture. Ordinarily, high frequency probe fixtures require a special probe station to hold them. This object if especially important in high volume wafer probing since commercial automatic or manual probe stations, such as used by Pacific Western, Electroglas, and TAC are normally used for wafer probing. Further, the hole in the center of the substrate is sized to fit most semiconductor ships under test. This permits the above mentioned shorter needles and less cantilever of the needles, reducing the impedance in the overall system.

These and other objects and advantages of the present invention will become apparent from the subsequent detailed description of the preferred embodiment and the appended claims taken in conjunction with the accompanying drawings.

BEST MODE FOR CARRYING OUT THE INVENTION

Figure 1:
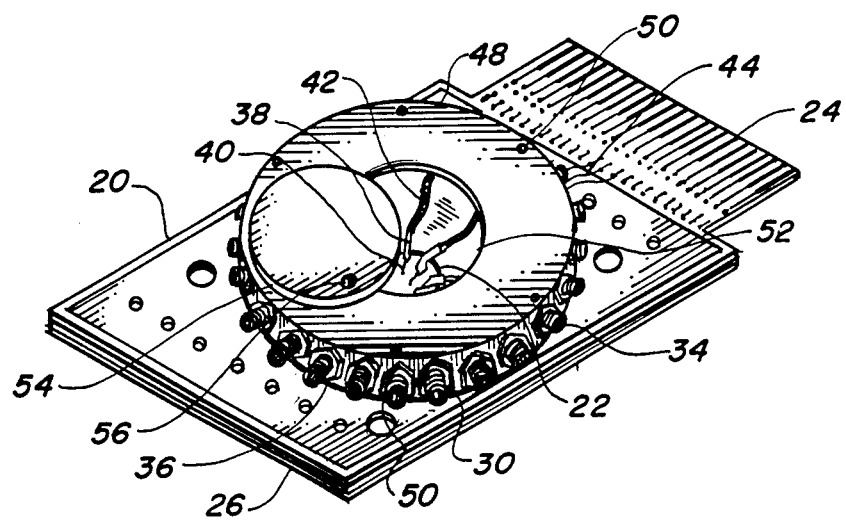
FIG. 1 is a partial isometric view of the preferred embodiment illustrated with the cover rotated to the side to expose the needles.
Figure 2:
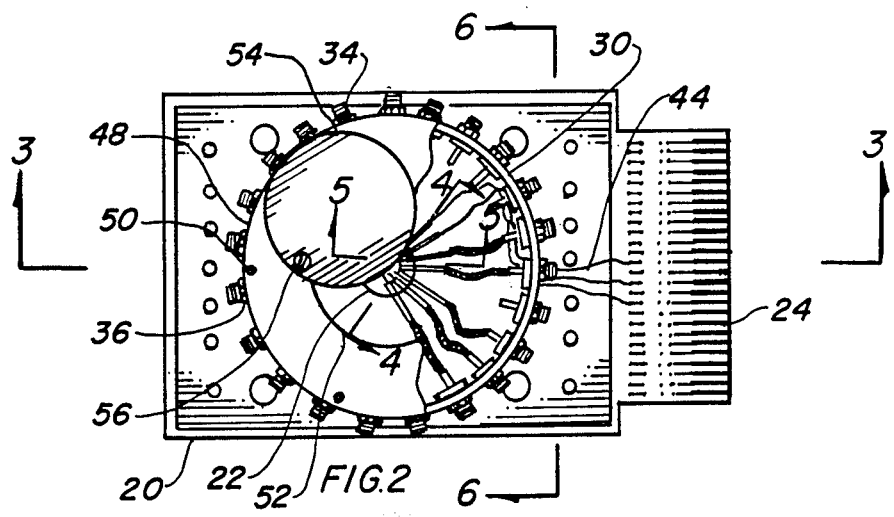
FIG. 2 is a plan view of the preferred embodiment.
Figure 3:
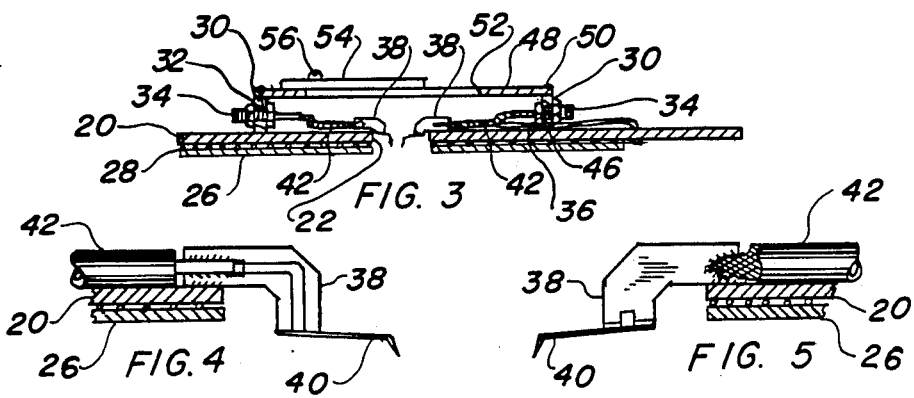
FIG. 3 is a cross-sectional view taken along lines 3—3 of FIG. 2.

The best mode for carrying out the invention is presented in terms of a preferred and a second embodiment. Both embodiments are primarily designed in the same manner, except the angle of the mounting ring is changed in respect to the printed circuit board.

The preferred embodiment, as shown in FIGS. 1 through 6 is comprised of a printed circuit board 20 having a ground plane on both the bottom and top side with a centrally located hole 22 in the middle. The board 20 further contains an electrically conductive edge connector 24 on one end. The board 20 may be fabricated for the particular application, varying in size and configuration to suit the probe station, or it may be commercially available, such as a standard 4.50×6.00 inches (11.43—15.24 centimeters) size, with a 70 conductor edge connector on one end. This size is relatively standard for a number of probe stations now on the market. The board may be the printed circuit glass-epoxy type, or may be a ceramic card, each with a ground plane metalized on both sides. Either the glass-epoxy or ceramic material will work with equal ease and will be of the same basic configuration. The ceramic card is more cost intensive, optimizing its use for the most demanding frequencies of over 10 gigahertz where the glass-epoxy would be utilized in the remainder of the spectrum. Each material would, therefore, have its own domain of optimum use. In either case, striplines from through holes for wires are located on the connector end interfacing electrically with the terminal pads. These pads utilize gold for the conductive surface to the mating connector. Stiffening means, in the form of a structural metal plate 26, is mechanically bonded onto the board 20 on the bottom side. This plate 26 also contains a hole in the center of the same size as the hole 22 in the board 20 allowing communication with the workpiece from the top. The plate 26 is bonded directly to the bottom ground plane with a conductive epoxy, or a metallic wire screen 28 may be used in between allowing the use of a less expensive epoxy adhesive, while still providing the integrity of the ground plane through the metallic conductance of the screen. This plate 26 further provides the mechanical strength requisite for manual manipulation of the probe board 20, reinforcing the structure, thereby reducing the possibility of breakage due to mishandling. Further, considerable mechanical stresses may be encountered by other mechanical structure on top of the board and, if not accounted for, may cause warpage beyond an acceptable level.

A connector mounting ring 30 is bonded onto the top ground plane of the board 20 in an axial position around the hole 22 with conductive epoxy, or the like. This ring 30 completely encircles the hole 22 and provides a mounting surface, as well as a mechanical RFI and EMI barrier shield. In the preferred embodiment, illustrated in FIGS. 1 through 6, the ring 30 has an upstanding edge that is at right angles to the board 20. Through the edge of the ring 30 are a series of equadistant holes 32 centrally located on the periphery. The number of holes may vary relative to the circumference of the ring, however, in the preferred card size, twenty-two holes 32 are optimally utilized.

Each hole 32 is sized to receive a threaded coaxial microwave connector 34. The hole may be threaded, or plain, with the plain being preferred, allowing the hexagonal head of the connector to almost touch each other on the flats when inserted from the inside. In the latter event, a lock ring and washer 36 are screwed onto the threaded body on the outside and secure the connector 34 to the ring 30. Since the connectors 34 are located axially, the spacing, while in close proximity on the inside of the ring, allows the coaxial cable to be easily connected on the shank, as sufficient space is available therebetween, due to the mounting angularity. The connector 34 may be any miniature or microminiature style, preferably the subminiature coaxial industry standard type SMA, having a stainless steel passivated body, rear mount, solder terminal, with a beryllium copper extended contact and thermoplastic insulator. This style is commonly used in the art with elevated frequencies, such as up to 20 gigahertz and higher, commonly used for connecting coaxial cables to testing apparatus. Other styles and types of connectors may also be utilized in the invention, provided they have an extended contact and threaded body. The body of the connector is mechanically grounded to the ring 30, which is, in turn, grounded to the probe board 20, completing continuity of the ground plane throughout the apparatus.

Figure 4:
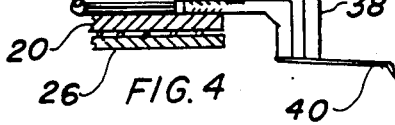
FIG. 4 is a partial cross-sectional view taken along lines 4—4 of FIG. 2, illustrating the needle on the stripline side.
Figure 5:
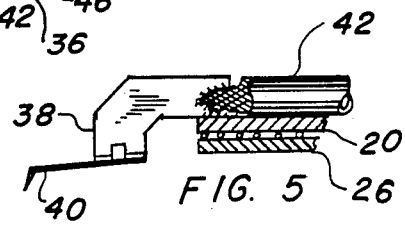
FIG. 5 is a partial cross-sectional view taken along lines 5—5 of FIG. 2, illustrating the ceramic needle on the ground plane side.

A plurality of stripline needle assemblies 38 are conductively bonded, preferably by soldering, on the top ground plane of the probe board 20 to the ground plane side of the needle assembly. These needle assemblies 38 consist of an angular L-shaped ceramic substrate with a stripline on one side and a ground plane on the other with a needle 40 disposed at the angular end parallel, but offset, to the major portion, as shown in FIGS. 4 and 5. This allows the needle 40 to be disposed within the hole 22 in the card 20, and as the needle 40 is bent downward, it is in position to align with node points and test points on the semi-conductor workpiece. Further, the needle 40 extends a short distance from the ceramic structure of the assembly 38 providing the necessary resilience to assure compliance with the workpiece without causing damage to the delicate pads, while still allowing a high frequency signal to be conducted. As previously discussed, the needle assembly 38 is commercially available and provides not only a 50 ohm impedance, but allows a convenient location to mount an optional chip resistor, or chip capacitor, thereupon.

It will be noted that the bonding of the needle assemblies 38 to the ground plane of the board 20 by soldering not only provides a structural mechanical junction, but also continues the electrical continuity of the ground, allowing the desired impedance to be sustained throughout the entire electrical flowpath of the apparatus.

Some of the needle assemblies 38 have means to connect to the microwave connectors 34 providing an electrical conductive flowpath for high frequency probing above one gigahertz. This is accomplished by the use of a coaxial cable or wire 42 having a metallic conductor enclosed in a dielectric sheath with a metallic woven shield on the outside. The conductor is soldered on one end to the connector 34 and on the other to the stripline on the ceramic needle assembly 38, as shown pictorially in FIG. 4. The shield is separated from the insulation and soldered to the ground plane of the needle assembly 38 on one end, as illustrated in FIG. 5, and to the outside of the connector 34 on the other. As the connector 34 and ceramic needle assembly 38 are parallel, but not planar, the coaxial cable 42 is bent offset in Z-shape to accommodate th difference in level.

Figure 6:
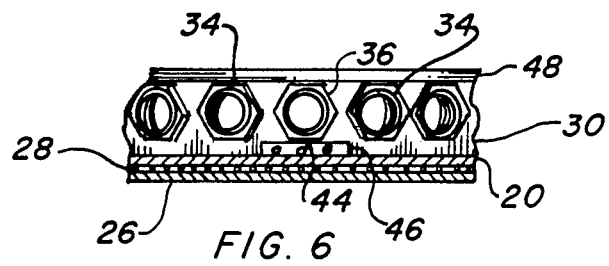
FIG. 6 is a cross-sectional view taken along lines 6—6 of FIG. 2, illustrating the method of directing the low frequency conducting wires through the mounting ring.

Other stripline needle assemblies 38 that service signal frequencies below one megahertz contain means to connect the needle 38 to the edge connector 24 of the board 20. This is accomplished using an insulated wire 44 having a stranded metallic conductor with a sheath of dielectric material on the outside. The wire 44 is soldered at one end to the stripline of the needle assembly 38 and to the edge connector 24 hole on the other. A cut-out 46 in the connector mounting ring 30, illustrated best in FIG. 6, provides an opening between the ring and the board 20. The wires 44 may be routed in any convenient position, and holes in the board 20 are provided at the interface with the edge connector portion 24 for ease of soldering.

In order to provide radio frequency interference and electromagnetic interference protection, a mechanical shield is provided for isolating the low capacitance and low noise signal within the apparatus. This is accomplished by the addition of a flat plate shield 48 attached mechanically by screws 50 directly to the exposed surface of the mounting ring 30. The shield 48 is formed with the same diameter as that of the ring 30 and is comprised of a metallic substance, such as aluminum. The shield 48 further contains a centrally located cavity 52 with a cover 54 rotatally disposed thereupon. The cover 54 is attached with a single threaded fastener 56 allowing rotation away from the cavity 52 clearly exposing the needles 40 through the hole 22 in the board 20 for positioning and rotated complete enclosure for testing. This arrangement allows conclusive isolation and mechanical structural shielding from environmental RFI or EMI that may be present during the conducting of the test to the workpiece.

In operation of the apparatus, the sharp tip of the needle 40 is directly over the workpiece, and allows spring movement when all needles 40 contact their respective wafer node and inspection points. This arrangement provides compliance with all points simultaneously. It will be noted that the access cavity 52 in the shield and the hole 22 in the board 20 provide visual indication of the workpiece, so as to align all of the needles 40 by precise physical movement of the fixture. All of the needles 40 are angularly bent at the appropriate orientation making the projection from the underside of the assembly 38 to the workpiece almost identical with any minor variation taken up by the resiliency of the needle shank.

A combination of high frequency and low frequency test signals may be used independently or in concert with this invention, and unwanted ambient signals may be eliminated completely by the mechanical shield provided.

Figure 7:
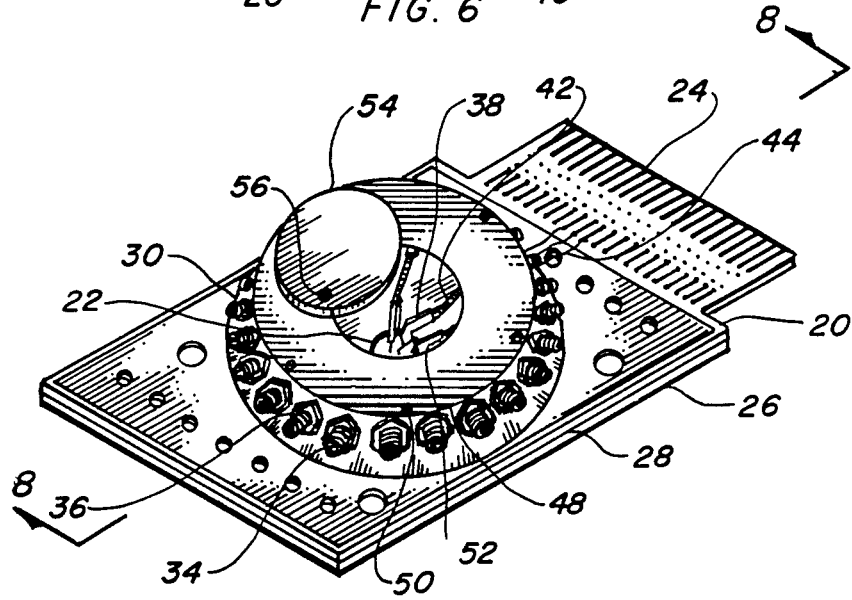
FIG. 7 is a partial isometric view of the second embodiment with the connector mounting ring at an acute angle to the ceramic card.
Figure 8:
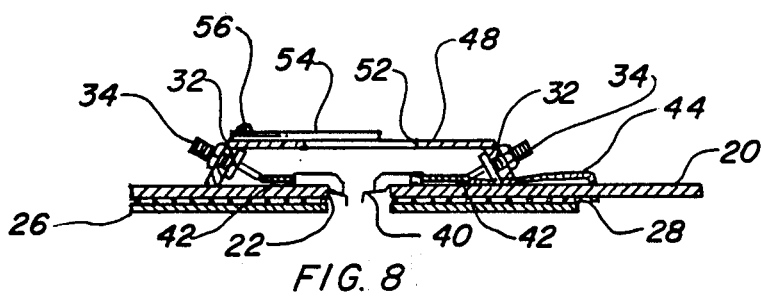
FIG. 8 is a cross-sectional view taken along lines 8—8 of FIG. 7.
Figure 9:
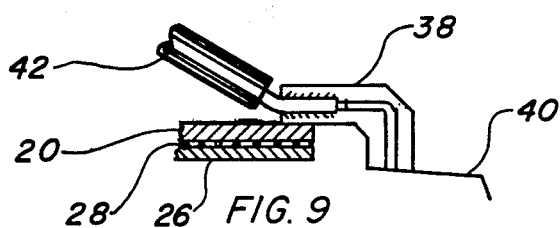
FIG. 9 is a detail view of the connector attached to the ceramic stripline needle assembly on the stripline side completely removed from the invention for clarity.

The second embodiment is identical to that of the preferred, except the upstanding edge of the connector mounting ring 30 is at an acute angle to the board 20. This allows the largest diameter to interface with the board 20 ultimately providing an angular surface for mounting the connectors 34. This configuration permits the connectors 34 to be in direct alignment with the needle assemblies 38, permitting a more direct connection and, therefore, higher frequency performance. This embodiment is illustrated in FIGS. 7 through 9 with the interface of the cable 42 to the needle assembly 38, depicted removed from the apparatus, but in proportional relation in FIG. 9. While this embodiment is more expensive to produce, the advantages of higher frequencies due to the straight alignment and ease of assembly are realized.

While the invention has been described in complete detail and pictorially shown in the accompanying drawings, it is not to be limited to such details, since many changes and modifications may be in the invention without departing from the spirit and the scope thereof. Hence, it is described to cover any and all modifications and forms which may come within the language and scope of the appended claims.

I claim:

1. A multipoint microwave semi-conductor wafer node point and inspection point coaxial probe card comprising:
    (a) a printed circuit board having a ground plane on both a bottom and top side, also a centrally located hole therein, further an electrically conductive edge connector on one end;
    (b) stiffening means affixed to the bottom side of said printed circuit board increasing the structural integrity of the board allowing handling and application thereof;
    (c) a connector mounting ring having an upstanding edge disposed upon the top of the printed circuit board encircling said hole providing a mounting surface and defining a mechanical barrier shield;
    (d) a plurality of threaded coaxial microwave connectors attached through said mounting ring in spaced relationship with the centrally located hole in the board having the connector body penetrating through the ring and mechanically attached on the outside thereof, providing means for an isolated electrical signal to be conducted through the mounting ring;
    (e) a plurality of angular ceramic stripline needle assemblies having a stripline on one side and a ground plane on the other and an offset needle, conductively bonded on the top ground plane side of the printed circuit board to the ground plane of the needle assemblies with the tips of the needles disposed within said hole in the board in such a position as to align with node points and test points on the semi-conductor wafer;
    (f) means to connect a portion of said stripline needle assemblies to said coaxial microwave connectors defining an electrical conductive flowpath therebetween for high frequency probing;

(g) means to connect a portion of said stripline needle assemblies to said board edge connector defining an electrical conductive flowpath therebetween for signal frequencies below one megahertz; and, (h) means to enclose said connector mounting ring on the side opposite the printed circuit board defining a radio frequency interference and electromagnetic interference shield for isolation of a low capacitance and low noise signal within the probe card apparatus.

2. A multipoint microwave semiconductor wafer node point and inspection point coaxial probe card wherein the stiffening means as recited in claim 1 further comprising: a structural metallic plate having an aperture centrally located therein mechanically bonded onto the printed circuit board such that the aperture is aligned with the hole in the board creating a clear opening therethrough for penetration of the stripline needle assemblies and further providing a mechanical reinforcement of sufficient structural integrity to be handled and mounted within a probe station.

3. A multipoint microwave semiconductor wafer node point and inspection point coaxial probe card wherein the connector mounting ring as recited in claim 1 wherein the upstanding edge is at right angles to the printed circuit board allowing the microwave connectors to be parallel to the board and the means to connect the stripline needle assemblies to the connector to be offset therebetween.

4. A multipoint microwave semiconductor wafer node point and inspection point coaxial probe card wherein the connector mounting ring as recited in claim 1 wherein the upstanding edge is at an acute angle to the printed circuit board with a larger diameter interfacing with the board such that the connectors are angular to the board and the means to connect the stripline needle assemblies to the connector are aligned therebetween.

5. A multipoint microwave semiconductor wafer node point and inspection point coaxial probe card wherein the means to connect a portion of said stripline needle assemblies to the microwave connectors as recited in claim 1 further comprising: a coaxial cable having a metallic conductor enclosed in a dielectric sheath with a metallic woven shield on the outside with said conductor attached on one end to the connector and the other to the stripline of the needle assemblies and the shield connected to the outside of the connector on one end and the ground plane of the needle assemblies on the other.

6. A multipoint microwave semiconductor wafer node point and inspection point coaxial probe card wherein the means to connect a portion of said stripline needles to the board edge connector as recited in claim 1 further comprising: an insulated wire having a stranded metallic conductor with a sheath of dielectric material on the outside thereof soldered at each terminating end to said needle and connector respectively.

7. A multipoint microwave semiconductor wafer node point and inspection point coaxial probe card wherein the bonding of the stripline needle assemblies to the printed circuit board of claim 1 further comprising: a solder connection, both electrically and mechanically joining the needles to the board.

8. A multipoint microwave semiconductor wafer node point and inspection point coaxial probe card wherein the means to enclose the connector mounting ring as recited in claim 1 further comprising: a flat plate shield having a cavity centrally located therein with a cover rotatably disposed over the cavity mechanically attached to the connector mounting ring allowing visual access to the inside through the cover and complete enclosure when the cover is shut.

9. A multipoint microwave semiconductor wafer node point and inspection point coaxial probe card wherein the flat plate shield as recited in claim 8 is comprised of a metallic substance and is connected to the ring by screws.

* * * * *